(12) United States Patent
Poplevine et al.

(10) Patent No.: US 8,363,469 B1
(45) Date of Patent: Jan. 29, 2013

(54) ALL-NMOS 4-TRANSISTOR NON-VOLATILE MEMORY CELL

(75) Inventors: Pavel Poplevine, Foster City, CA (US);
Umer Khan, Santa Clara, CA (US);
Hengyang (James) Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/698,318

(22) Filed: Feb. 2, 2010

(51) Int. Cl.
*G11C 11/34* (2006.01)
*G11C 16/04* (2006.01)
(52) U.S. Cl. ......... 365/185.05; 365/185.18; 365/185.19; 365/63; 365/72
(58) Field of Classification Search .......... 365/185.01–185.33, 63, 72
See application file for complete search history.

(56) References Cited

U.S. PATENT DOCUMENTS

| | | | | |
|---|---|---|---|---|
| 6,137,723 | A | 10/2000 | Bergemont et al. | 365/185.18 |
| 6,188,594 | B1 | 2/2001 | Ong | 365/49 |
| 6,434,040 | B1 | 8/2002 | Kim et al. | 365/154 |
| 6,903,978 | B1 | 6/2005 | Mirgorodski et al. | 365/185.28 |
| 6,985,386 | B1 * | 1/2006 | Mirgorodski et al. | 365/185.05 |
| 6,992,927 | B1 | 1/2006 | Poplevine et al. | 365/185.05 |
| 7,164,606 | B1 | 1/2007 | Poplevine et al. | 365/185.28 |
| 7,483,310 | B1 * | 1/2009 | Bu | 365/185.26 |
| 7,623,380 | B2 * | 11/2009 | Yamamoto et al. | 365/185.1 |
| 2005/0047196 | A1 | 3/2005 | Bhavnagarwala et al. | 365/154 |
| 2009/0129162 | A1 | 5/2009 | Poplevine et al. | 365/185.8 |

OTHER PUBLICATIONS

"Notification of Transmittal of the International Search Report and the Written Opinion of the International Searching Authority", PCT/US2010/058203, mailing date: Jul. 26, 2011.

* cited by examiner

*Primary Examiner* — Kretelia Graham
(74) *Attorney, Agent, or Firm* — Wade J. Brady, III; Frederick J. Telecky, Jr.

(57) ABSTRACT

A non-volatile memory cell includes NMOS programming, read, erase, and control transistors having gate electrodes connected to a storage node. The erase and control transistors have interconnected source, drain, and bulk electrodes. The cell is programmed by setting source, drain, bulk, and gate electrodes of all transistors to a positive voltage. An inhibiting voltage is applied to source, drain, and bulk electrodes of the read transistor, while setting source and drain electrodes of the programming transistor to the positive voltage and the bulk electrode of the programming transistor to the positive voltage or the inhibiting voltage. Source, drain, and bulk electrodes of the control transistor are then ramped to a negative control voltage while ramping source, drain, and bulk electrodes of the erase transistor to a negative erase voltage and then back to the positive voltage. Source, drain. bulk, and gate electrodes of the programming, erase, and control transistors are then returned to the positive voltage, while setting the source, drain, and bulk electrodes of the read transistor to the inhibiting voltage.

5 Claims, 6 Drawing Sheets ated on Jan. 16, 2007, to Poplevine et al., discloses an

ALL-NMOS 4-TRANSISTOR NON-VOLATILE MEMORY CELL

FIELD OF THE INVENTION

The present invention relates to integrated circuit memory devices and, in particular, to an all-NMOS 4-transistor non-volatile memory (NVM) cell that utilizes reverse Fowler-Nordheim tunneling for programming.

BACKGROUND OF THE INVENTION

Commonly-assigned U.S. Pat. No. 7,164,606, which issued on Jan. 16, 2007, to Poplevine et al., discloses an all-PMOS 4-transistor non-volatile memory (NVM) cell that utilizes reverse Fowler-Nordheim tunneling for programming.

Referring to FIG. 1, as disclosed in U.S. Pat. No. 7,164,606, in accordance with the method of programming an NVM array that includes all-PMOS 4-transistor NVM cells 100 having floating gate electrodes that are commonly-connected to a storage node $P_s$, for each NVM cell in the array that is to be programmed, all of the electrodes of the cell are grounded. An inhibiting voltage $V_n$ is then applied to the bulk-connected source electrode $V_r$ of the cell's read transistor $P_r$, to the commonly-connected drain, bulk region and source electrodes $V_e$ of the cell's erase transistor $P_e$, and to the drain electrode $D_r$ of the read transistor $P_r$. The source electrode $V_p$ and the drain electrode $D_p$ of the cell's programming transistor $P_w$ are grounded. The voltage applied to the bulk region electrode $V_{nw}$ of the programming transistor $P_w$ is optional; it can be grounded or it can remain at the inhibiting voltage $V_n$. For all NVM cells in the array that are not selected for programming, the inhibiting voltage $V_n$ is applied to the $V_r$, $V_e$ and $D_r$ electrodes and is also applied to the $V_p$, $D_p$ and $V_{nw}$ electrodes. For cells to be programmed, the control voltage $V_c$ of the cell's control transistor $P_c$ is then swept from 0V to a maximum programming voltage $V_{cmax}$ in a programming time $T_{prog}$. The control voltage $V_c$ is then ramped down from the maximum programming voltage $V_{cmax}$ to 0V. All electrodes of the cell and the inhibiting voltage $V_n$ are then returned to ground.

As described in detail in the '606 patent, the all-PMOS 4-transistor NVM cell disclosed therein relies on reverse Fowler-Nordheim tunneling for programming. That is, when the potential difference between the floating gate electrode of the programming transistor of the all-PMOS NVM cell and the drain, source and bulk region electrodes of the programming transistor exceeds a tunneling threshold voltage, electrons tunnel from the drain and source electrodes to the floating gate, making the floating gate negatively charged.

U.S. Pat. No. 7,164,606 is hereby incorporated by reference herein in its entirety to provide background information regarding the present invention.

The all-PMOS 4-transistor NVM cell programming technique disclosed in the '606 patent provides advantages of both low current consumption, allowing the ability to simultaneously program a large number of cells in a cell array without the need for high current power sources, and a simple program sequence. However, the 4-transistor PMOS NVM cell cannot be used in certain integrated circuit fabrication processes wherein n-epitaxial silicon is grown that shorts all N-wells together or where each N-well needs to be surrounded by an individual N+, P+, or trench guard ring and charge will be lost if the floating polysilicon gate crosses the guard ring.

Thus, there is a need for an NVM cell design that can be used in processes where an all-PMOS 4-transistor NVM cell is not possible, but retains the advantages of the all-PMOS 4-transistor cell.

SUMMARY OF THE INVENTION

The present invention provides a method of programming a non-volatile (NVM) memory cell array that includes a plurality of all-NMOS 4-transistor NVM cells. Each all-NMOS NVM cell in the NVM cell array includes a first NMOS programming transistor having a drain electrode, a bulk region electrode, a source electrode and a gate electrode connected to a common storage node, a second NMOS read transistor having a drain electrode, a bulk region electrode, a source electrode and a gate electrode connected to the common storage node, a third NMOS erase transistor having commonly-connected source, drain and bulk region electrodes and a gate electrode connected to the common storage node, and a fourth NMOS control transistor having commonly-connected source, drain and bulk region electrodes and a gate electrode connected to the common storage node. The programming method comprises: for each NVM cell in the array, setting the source, drain and bulk region electrodes and the gate electrodes of the first, second, third and fourth NMOS transistors to a positive reference voltage; for each NVM cell in the array selected for programming, applying an inhibiting voltage to the source, drain and bulk region electrodes of the second NMOS read transistor while setting the source and drain electrodes of the first NMOS programming transistor to the positive reference voltage and maintaining the bulk region electrode of the first NMOS programming transistor at either the positive reference voltage or at the inhibiting voltage; for each NVM cell in the NVM cell array not selected for programming, setting the source, drain and bulk region electrodes of the second NMOS read transistor and of the first NMOS programming transistor to the inhibiting voltage; for each NVM cell in the array selected for programming, ramping down the interconnected source, drain and bulk region electrodes of the fourth NMOS control transistor from the positive reference voltage to a minimum control voltage for a preselected programming time while ramping down the interconnected source, drain and bulk region electrodes of the third NMOS erase transistor from the positive reference voltage to a minimum erase voltage for the preselected programming time; for each NVM cell in the array selected for programming, at the end of the preselected programming time, ramping up the interconnected source, drain and bulk region electrodes of the fourth NMOS control transistor from the minimum control voltage to the positive reference voltage while ramping up the interconnected source, drain and bulk region electrodes of the third NMOS erase transistor from the minimum erase voltage to the positive reference voltage; and, for each NVM cell in the array selected for programming, returning the source and drain electrodes and the gate electrodes of the first, third and fourth NMOS transistors to the positive reference voltage while setting the source, drain and bulk region electrodes of the second NMOS read transistor to the inhibiting voltage.

The features and advantages of the various aspects of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 2:
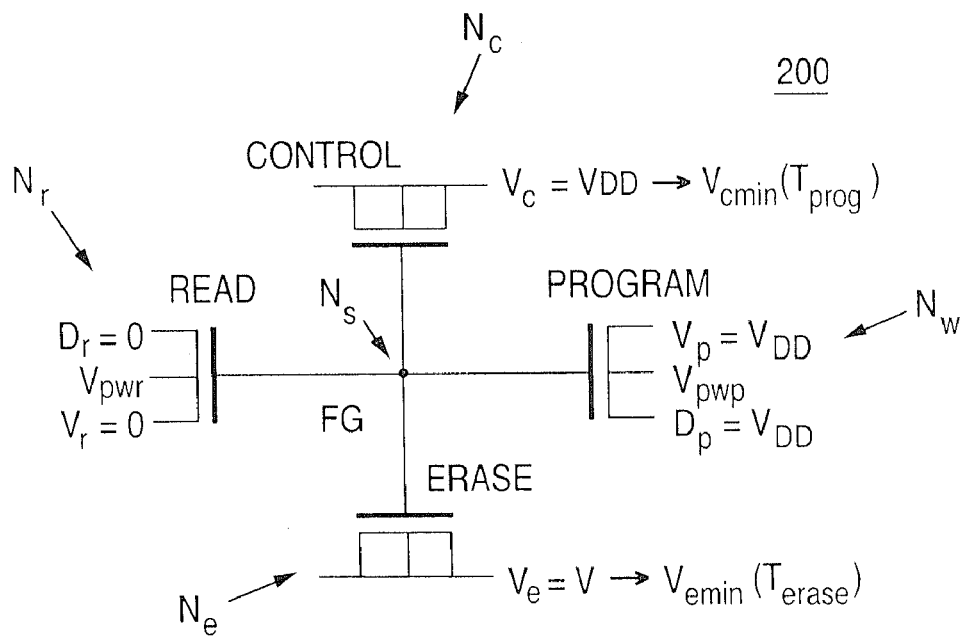
FIG. 2 is a schematic diagram illustrating an embodiment of an all-NMOS 4-transistor NVM cell in accordance with the concepts of the present invention.

FIG. 2 shows an all-NMOS 4-transistor non-volatile memory (NVM) cell 200 that includes four NMOS transistors connected to a common storage node $N_s$. As described in greater detail below, one NMOS transistor is provided for each of the four NVM cell functions: program (or write), read, erase and control.

The programming function of the NVM cell 200 is controlled by a first NMOS programming transistor $N_w$ having a source electrode that receives a source programming voltage $V_p$, a drain electrode that receives a drain programming voltage $D_p$ and a bulk region electrode that receives a bulk programming voltage $V_{pwp}$. The gate electrode of programming transistor $N_w$ is connected to the common storage node $N_s$.

The read function of the NVM cell 200 is controlled by a second NMOS read transistor $N_r$ having a source electrode that receives a source read voltage $V_r$, a drain electrode that receives a drain read voltage $D_r$ and a bulk region electrode that receives a bulk read voltage $V_{pwr}$. The gate electrode of the read transistor $N_r$ is connected to the common storage node $N_s$.

The erase function of the NVM cell 200 is controlled by a third NMOS erase transistor $N_e$ having interconnected source, drain and bulk region electrodes to which an erase voltage $V_e$ is applied. The gate electrode of the erase transistor $N_e$ is connected to the common storage node $N_s$.

The control function of the NVM cell 200 is controlled by a fourth NMOS control transistor $N_c$ having interconnected source, drain and bulk region electrodes to which a control voltage $V_c$ is applied. The gate electrode of the control transistor $N_c$ is connected to the common storage node $N_s$.

The above-referenced '606 patent describes in detail how the reverse Fowler-Nordheim tunneling programming technique works for the all-PMOS 4-transistor NVM cell and the sequences for program, erase and read operations. The program, erase and read operations for the all-NMOS 4-transistor NVM cell 200 of the present invention are complimentary to those operations for the all-PMOS cell. That is, the program, erase and read sequences are the same with different polarity for voltages. In the case of the all-PMOS cell, the circuit reference voltage is 0V; for the all-NMOS cell, the reference voltage is positive ($V_{DD}$). In the case of the all-PMOS cell, the inhibiting voltage $V_n$ is a positive voltage; in the case of the all-NMOS cell, the inhibiting voltage $V_n$ is 0V.

In the case of the all-PMOS cell, the control voltage $V_c$ and the erase voltage $V_e$ are positive voltages $V_{cmax}$ and $V_{emax}$, respectively; for the all-NMOS cell, the control voltage $V_c$ and the erase voltage $V_e$ are negative voltages $V_{cmin}$ and $V_{emin}$, respectively.

With reference to FIG. 2, to program the all-NMOS 4-transistor NVM cell 200, the source, drain, bulk region and gate electrodes of the first NMOS programming transistor $N_w$, the second NMOS read transistor $N_r$, the third NMOS erase transistor $N_e$ and the fourth NMOS control transistor $N_c$ are all initially set to the positive reference voltage $V_{DD}$. The inhibiting voltage $V_n$ (0V) is applied to the source, drain and bulk region electrodes of the second NMOS read transistor $N_r$, while setting the source and drain electrodes of the first NMOS programming transistor $N_w$ to the positive reference voltage $V_{DD}$ and maintaining the bulk region electrode of the first NMOS programming transistor $N_w$ at the positive reference voltage. $V_{DD}$ or the inhibiting voltage $V_n$ (0V). The interconnected source, drain and bulk region electrodes of the fourth NMOS control transistor $N_c$ are then ramped down from the positive reference voltage $V_{DD}$ to a minimum negative control voltage $V_{cmin}$ for a programming time $T_{prog}$ while ramping down the interconnected source, drain and bulk region electrodes of the third NMOS erase transistor $N_e$ from the positive reference voltage $V_{DD}$ to a minimum negative erase voltage $V_{emin}$ for the programming time $T_{prog}$. At the end of the programming time $T_{prog}$, the interconnected source, drain and bulk region electrodes of the fourth NMOS control transistor $N_c$ are ramped up from the minimum negative control voltage $V_{cmin}$ to the positive reference voltage while ramping up the interconnected source, drain and bulk region electrodes of the third NMOS erase transistor $N_e$ from the minimum negative erase voltage $V_{emin}$ to the positive reference voltage $V_{DD}$. The source, drain and bulk region electrodes of the first, third and fourth NMOS transistors are then returned to the positive reference voltage $V_{DD}$ while setting the source, drain and bulk region electrodes of the second NMOS read transistor $N_r$ to the inhibiting voltage $V_n$ (0V).

Figure 7:
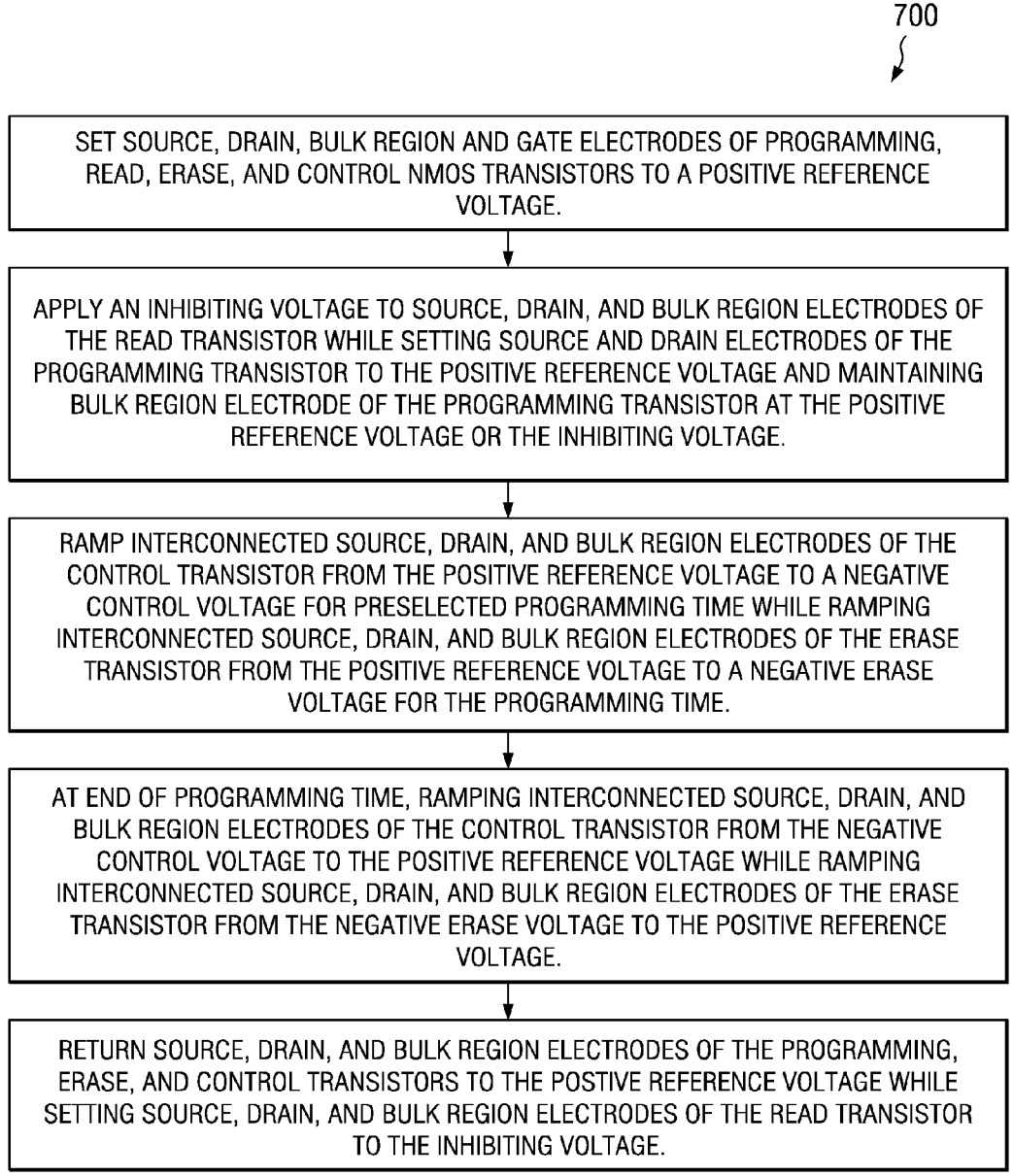
FIG. 7 is a flow chart showing a programming sequence for a non-volatile memory cell.

FIG. 7 is a flow chart showing a programming sequence 700 for the NMV cell 200 of FIG. 2.

Figure 3:
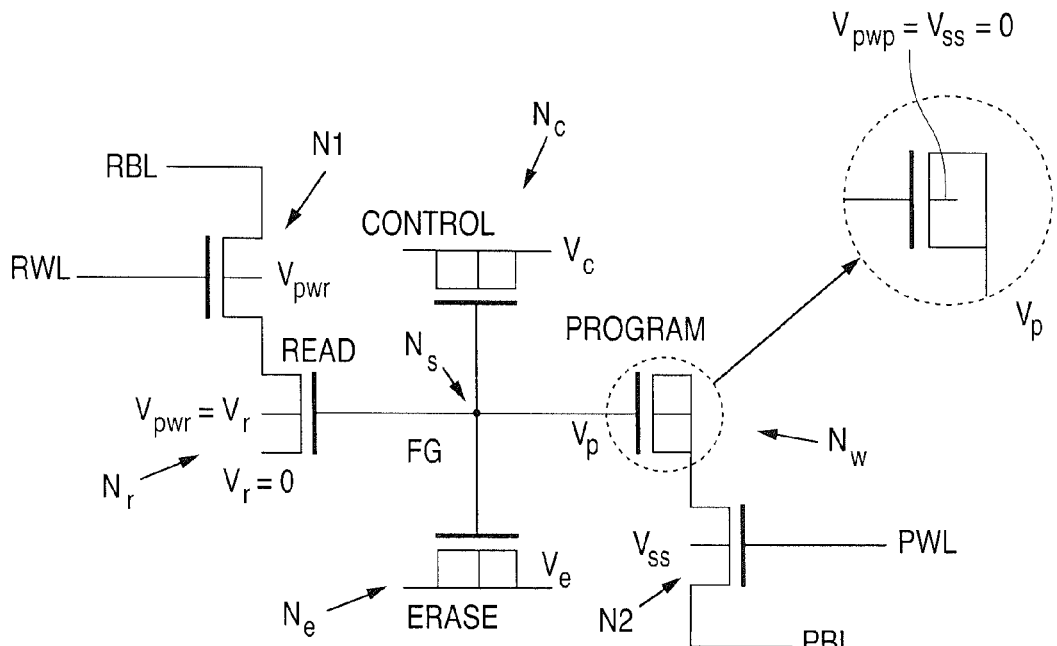
FIG. 3 is a schematic diagram illustrating an embodiment of the FIG. 2 NVM cell adapted for incorporation into an NVM cell array.

FIG. 3 shows the all-NMOS transistor NVM cell 200 adapted to include additional N-channel pass transistors N1 and N2 for facilitating use of NVM cell 200 within an NVM cell array. For example, to read data from the common storage node $N_s$, N-channel pass transistor N1 is used by placing logic hi on read word line node RWL and sensing current on read bit line node RBL. To program data to the common storage node $N_s$, N-channel pass transistor N2 is used by placing logic hi on program word line node PWL and logic hi on program bit line node PBL to get logic hi on the programming transistor source node $V_p$ of the cell to be programmed (or by placing logic low on node PBL to get logic low on the source node $V_p$ to keep the cell at the erase stage). The dashed circles in FIG. 3 show a possible alternate implementation of the programming transistor $N_w$ with interconnected source, drain and bulk region electrodes utilizing a programming transistor $N_w$ with interconnected source and drain electrodes and a bulk region electrode that can be set to either the positive reference voltage $V_{DD}$ or the inhibiting voltage 0V.

Figure 3A:
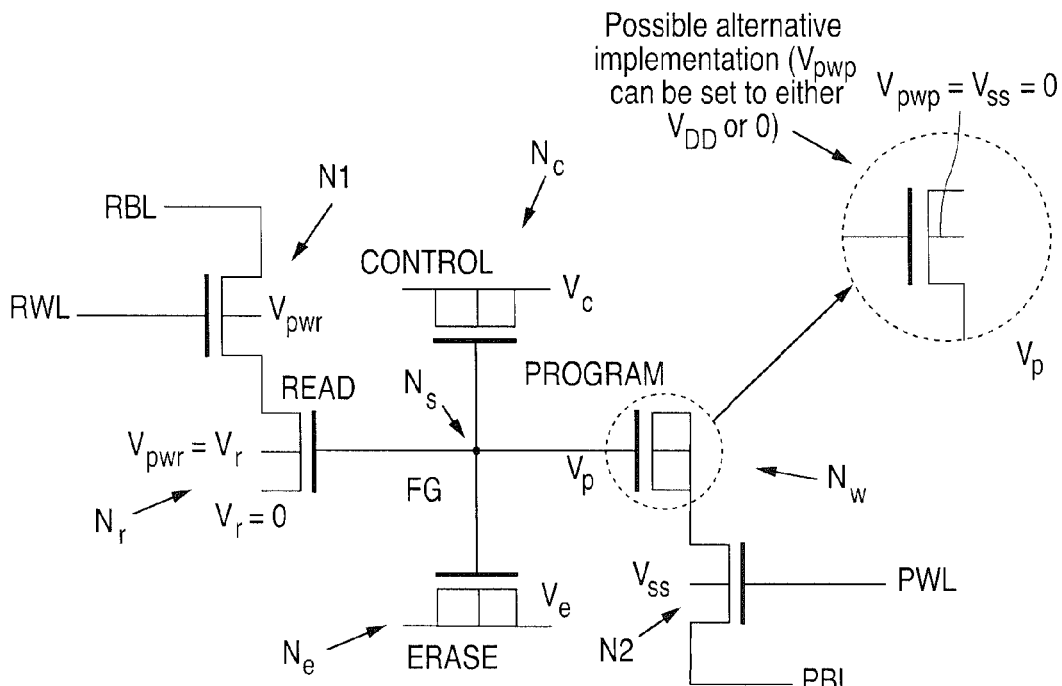
FIG. 3A is a schematic diagram illustrating an alternate embodiment of the FIG. 2 NVM cell adapted for incorporation into an NVM cell array.

FIG. 3A shows an alternate embodiment of the FIG. 3 adapted NVM cell. All aspects of the FIG. 3A adapted cell are the same as those of the FIG. 3 adapted cell except for the configuration of the programming transistor $N_w$. FIG. 3A shows a programming transistor $N_w$ having a source electrode and commonly-connected drain and bulk region electrodes and a gate electrode connected to the common storage node $N_s$. The dashed circles in FIG. 3A show another possible alternate embodiment in which the programming transistor $N_w$ having independent source, drain and bulk region electrodes and a gate electrode connected to the common storage node $N_s$.

Thus, possible biasing combinations for the programming transistor $N_w$ are as follows:
1) $V_p=V_{DD}$, $D_p=V_{DD}$, $V_{pwp}=V_{DD}$ (FIG. 3)
2) $V_p=V_{DD}$, $D_p=V_{DD}$, $V_{pwp}=V_{ss}$ (FIG. 3 alternate)
3) $V_p=V_{DD}$, $D_p$=floating, $V_{pwp}=V_{DD}$ (FIG. 3A)
4) $V_p=V_{DD}$, $D_p$=floating, $V_{pwp}=V_{ss}$ (FIG. 3A alternate)

Those skilled in the art will appreciate that, from a transistor point of view, the source and drain are interchangeable, so $V_p=V_{DD}$, $D_p$ floating are equal to $V_p$ floating, $D_p=V_{DD}$, from a functionality point of view.

Figure 4:
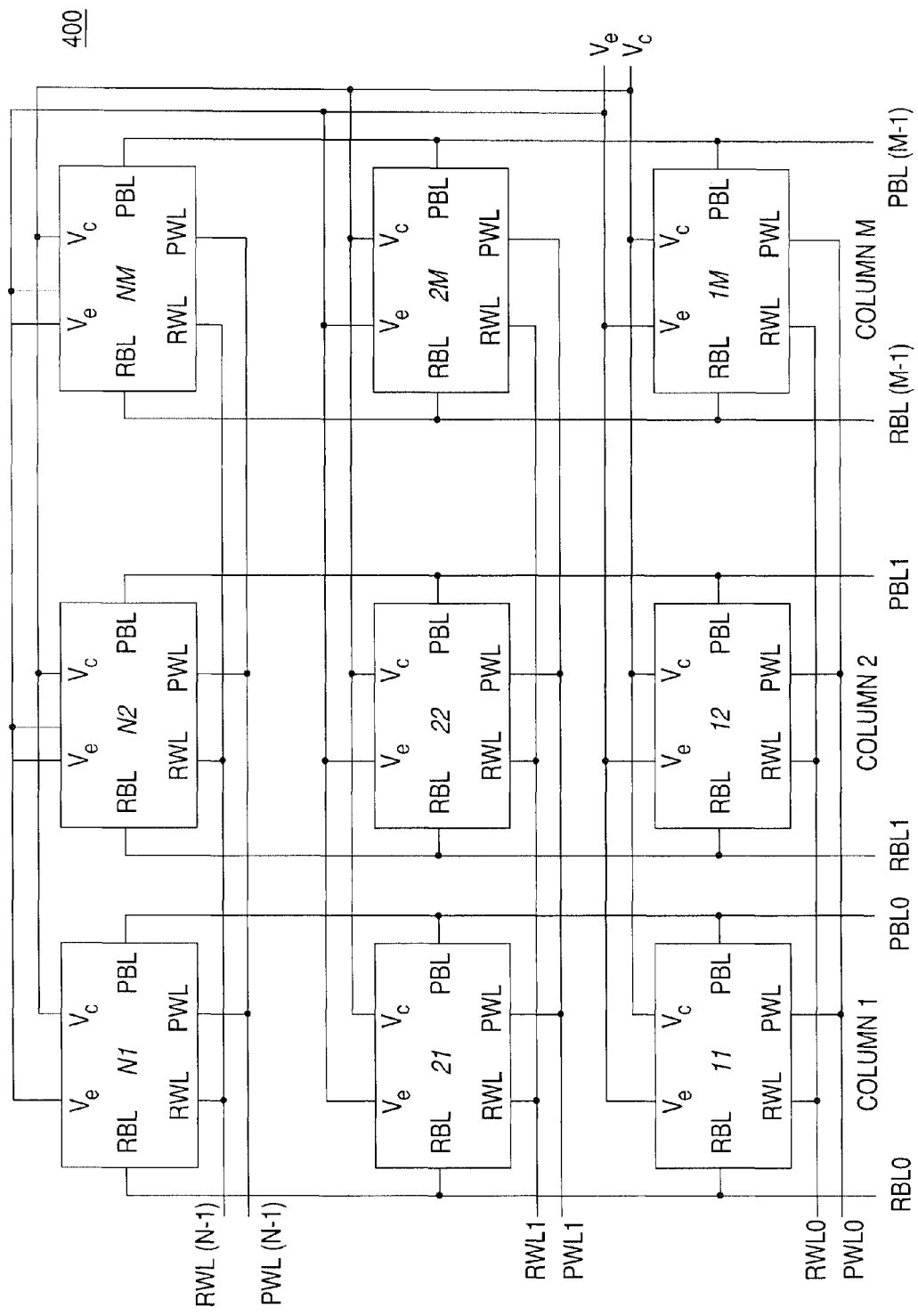
FIG. 4 is a schematic diagram illustrating an embodiment of an NVM cell array that includes a plurality of adapted NVM cells of the type shown in FIGS. 3 and 3A.

FIG. 4 shows a plurality of NVM cells 200, which may be of the type shown in FIGS. 3 and 3A, incorporated into an NVM cell array 400. The erase voltage $V_e$ and the control voltage $V_c$ are applied directly to each NVM cell in the array 500. With no high voltage switches or other supporting circuitry, significantly simplified connection can be made from the array 500 to external or internal voltage and signal sources and to signal destinations. As stated above, the program voltage $V_p$ is delivered to each cell individually through N-channel pass transistor N2 (FIGS. 3, 3A) to program the cell or to keep it at the erase stage.

During the erase mode, all read word lines (RWL) and program word lines (PWL) of the array 400 are at logic low and the erase voltage $V_e$ is applied; the rest of the circuit lines of the array 400 are held at the positive reference voltage $V_{DD}$.

During the programming mode, all of the read word lines (RWL) of the array 400 are at logic low, one of the program word lines, e.g., PWL(0), will be at logic hi, while the remaining program world lines PWL(1)-PWL(N-1) will be at logic low. To program a particular cell in the array 400, the corresponding program bit line, e.g., PBL(0), will be at logic high; to keep the remaining cells in the array 500 at the erase state, the corresponding program bit line PBL will be at logic low. Then both the control voltage $V_c$ and the erase voltage $V_e$ are applied to all cells in the array 400, while the rest of the signal lines are set at the positive reference voltage $V_{DD}$.

During the read mode, all program word lines (PWL) in the array 400 are at logic low, one of the read word lines, e.g., RWL(0), will be at logic hi, while the remaining read word lines RWL(0)-RWL(N-1) in the array 400 will be at logic low. On each of the read bit lines RBL(0)-RBL(M-1), a high current or voltage will be received for each corresponding cell in the array that had been programmed, while a low current or voltage will be received for each corresponding cell that had been erased.

Referring to FIGS. 2, 3, 3A and 4, a summary of the program, erase and read sequences for the all-NMOS cell in an array 400 is as follows:

Program Sequence

Setting the source, drain, bulk region and gate electrodes of the first NMOS programming transistor $N_w$, the second NMOS read transistor $N_r$, the third NMOS erase transistor $N_e$ and the fourth NMOS control transistor $N_c$ to a positive reference voltage ($V_{DD}$). For each NVM cell in the NVM cell array 400 selected for programming, applying an inhibiting voltage (0V) to the source, drain and bulk region electrodes of the read transistor $N_r$, while setting the source and drain electrodes of the programming transistor $N_w$ to the positive reference voltage and maintaining the bulk region electrode of the programming transistor at either the positive reference voltage ($V_{DD}$) or the inhibiting voltage (0V). For each NVM cell in the NVM cell array 400 not selected for programming, setting the source, drain and bulk region electrodes of the read transistor $N_r$ and of the programming transistor $N_w$ to the inhibiting voltage (0V). Ramping down the interconnected source, drain and bulk region electrodes of the control transistor $N_c$ from the positive supply voltage ($V_{DD}$) to a predefined negative control voltage $V_{cmin}$ for a preselected programming time $T_{prog}$ while ramping down the interconnected source, drain and bulk region electrodes of the erase transistor $N_e$ to a predefined negative erase voltage $V_{emin}$ for the preselected programming time $T_{prog}$. For each NVM cell in the NVM cell array 400 selected for programming, at the end of the preselected programming time $T_{prog}$, ramping up the interconnected source, drain and bulk region electrodes of the control transistor $N_c$ from the predefined negative control voltage $V_{cmin}$ to the positive reference voltage ($V_{DD}$) while ramping up the interconnected source, drain and bulk region electrodes of the erase transistor $N_e$ from the predefined negative erase voltage $V_{emin}$ to the positive reference voltage ($V_{DD}$). For each NVM cell in the NVM cell array, returning the source, drain, bulk region and gate electrodes of the programming transistor $N_w$, the erase transistor $N_e$ and the control transistor $N_c$ to the positive reference voltage ($V_{DD}$) while setting the source, drain and bulk region electrodes of the read transistor $N_r$ to the inhibiting voltage (0V).

Figure 8:
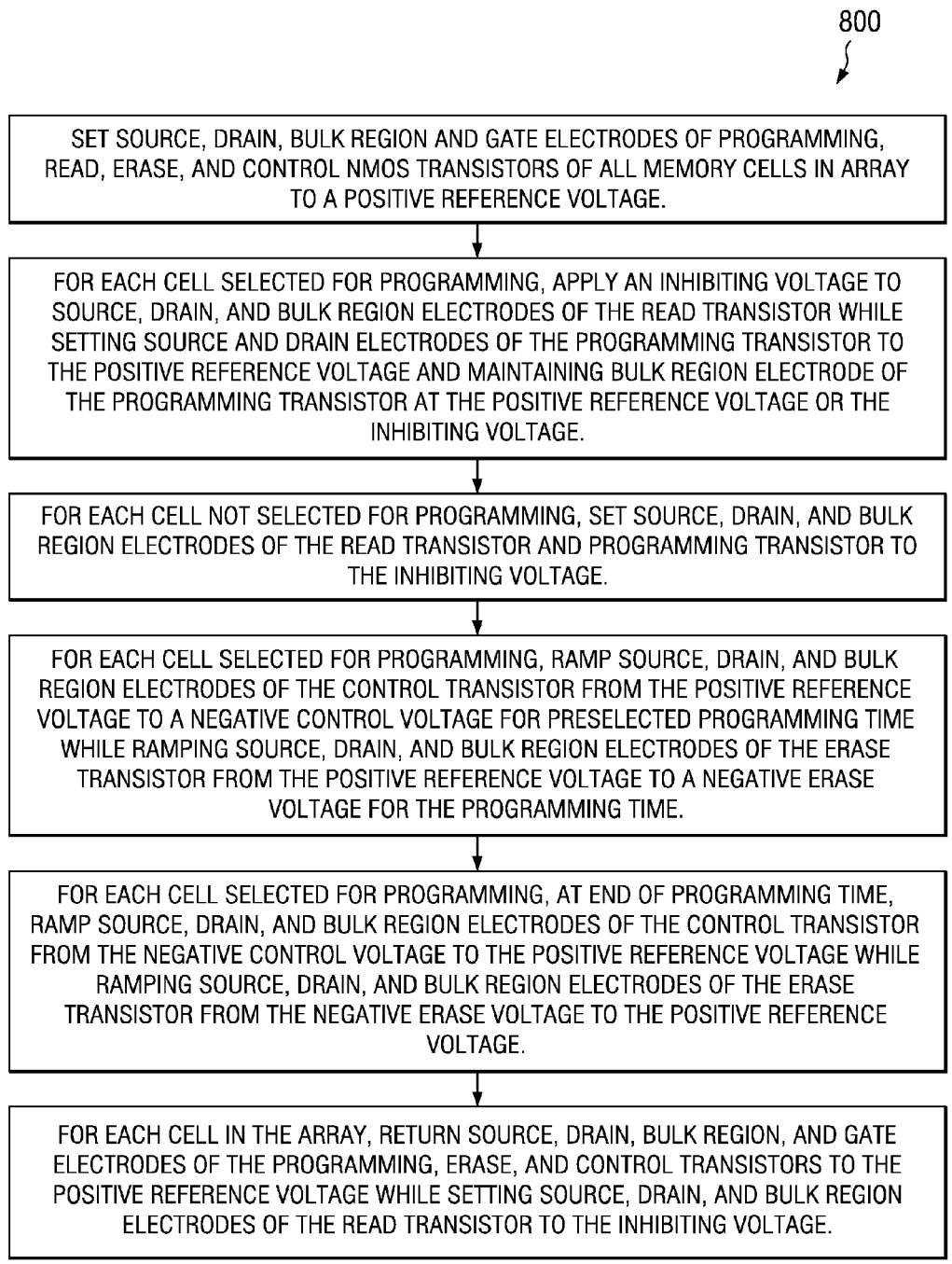
FIG. 8 is a flow chart showing a programming sequence for a non-volatile memory cell array.

FIG. 8 is a flow chart showing a programming sequence 800 for the NMV cell array 400 of FIG. 4.

Erase Sequence

For each NVM cell in the array 400 to be erased, ramp down the erase voltage electrode $V_e$ from the positive reference voltage ($V_{DD}$) to the predefined negative erase voltage $V_{emin}$ for a preselected erase time $T_{erase}$ and then ramp the erase voltage electrode $V_e$ from the negative erase voltage $V_{emin}$ back to the positive reference voltage ($V_{DD}$). All other electrodes in the cell to be erased are set to the positive reference voltage ($V_{DD}$).

Read Sequence

For each NVM cell in the array 400 to be read, set the read voltage electrode $V_r$ to about 1V and the drain and bulk region electrodes of the read transistor $N_r$ to 0V (e.g., sufficient voltage to be able to read the cell current while preventing disturb to the programmed cells.) All other electrodes in the cell to be read are set to the positive reference voltage ($V_{DD}$).

Those skilled in the art will appreciate that the voltage levels utilized in the program, erase and read sequences will depend upon the thickness of the gate oxide utilized in the NMOS transistors of the NVM cell. For example, for a gate oxide thickness of 80 Å, $V_{DD}$=3.3V, $V_{cmin}=V_{emin}$=-6.7V, $T_{prog}=T_{erase}$=20-50 ms. For a gate oxide thickness of 120 Å, $V_{DD}$=5V, $V_{cmin}=V_{emin}$=-11V.

Figure 1:
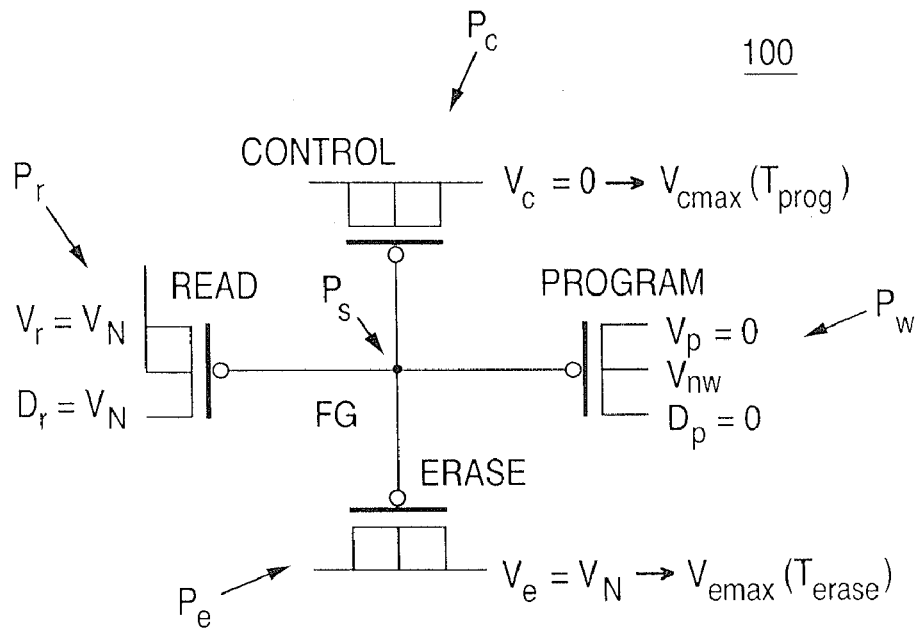
FIG. 1 is a schematic diagram illustrating an all-PMOS 4-transistor NVM cell.
Figure 5:
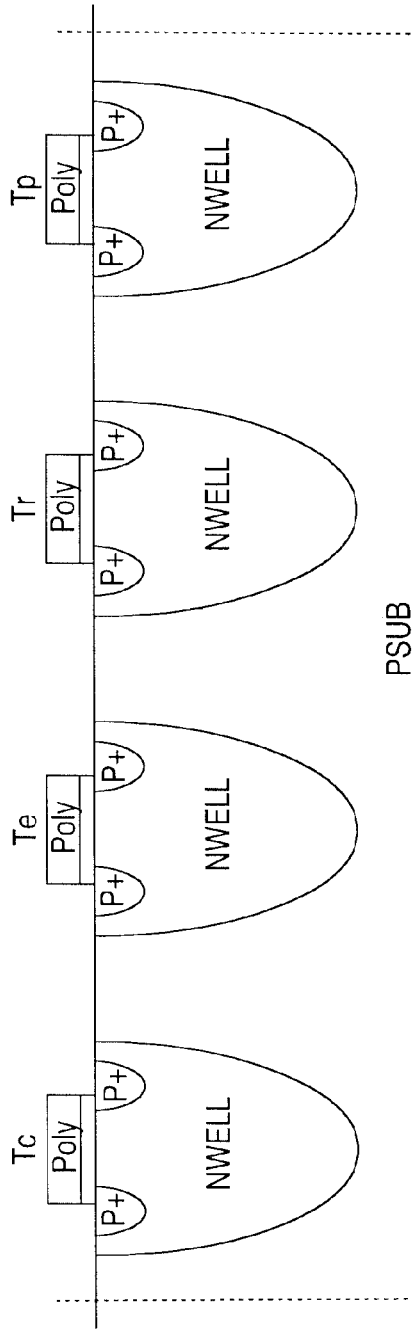
FIG. 5 is a cross-section drawing illustrating the FIG. 1 all-PMOS 4-transistor NVM cell.
Figure 6:
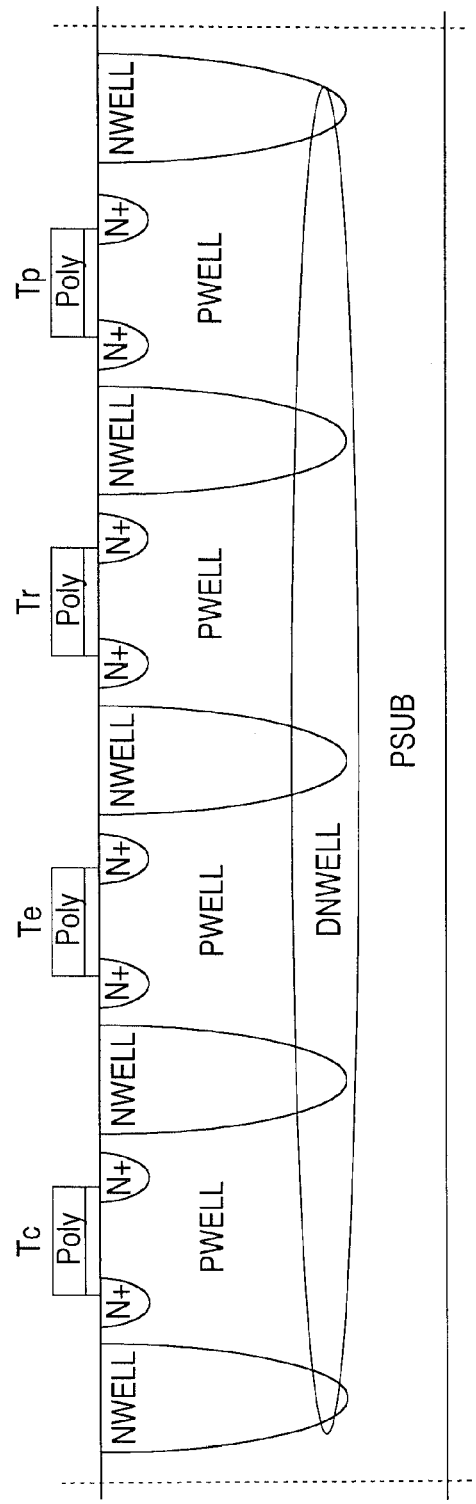
FIG. 6 is a cross-section drawing illustrating the FIG. 2 embodiment of an all-NMOS NVM cell in accordance with concepts of the present invention.

FIG. 5 and FIG. 6 show, respectively, cross-sections of the FIG. 1 all-PMOS 4-transistor NVM cell and the FIG. 2 all-NMOS NVM cell. As shown in FIG. 6, the all-NMOS NVM cell utilizes an isolated P-well (PWELL). This results in smaller cell area compared to the all-PMOS cell because the spacing between the separated P-wells (which represent minimum N-well width) is smaller than the spacing between the separated N-wells in a P-substrate.

It should be understood that the particular embodiments of the invention described above have been provided by way of example and that other modifications may occur to those skilled in the art without departing from the scope of the invention as expressed in the appended claims and their equivalents.

What is claimed is:

1. A non-volatile memory (NVM) cell comprising:

a first NMOS programming transistor having a drain electrode, a bulk region electrode, a source electrode, and a gate electrode connected to a common storage node;

a second NMOS read transistor having a drain electrode, a bulk region electrode, a source electrode, and a gate electrode connected to the common storage node;

a third NMOS erase transistor having interconnected source, drain and bulk region electrodes and a gate electrode connected to the common storage node; and a fourth NMOS control transistor having interconnected source, drain and bulk region electrodes and a gate electrode connected to the common storage node.

2. A method of programming a non-volatile memory (NVM) cell, the NVM cell including a first NMOS programming transistor having a drain electrode, a bulk region electrode, a source electrode and a gate electrode connected to a common storage node, a second NMOS read transistor having a drain electrode, a bulk region electrode, a source electrode and a gate electrode connected to the common storage node, a third NMOS erase transistor having interconnected source, drain and bulk region electrodes and a gate electrode connected to the common storage node, and a fourth NMOS control transistor having interconnected source, drain and bulk region electrodes and a gate electrode connected to the common storage node, the NVM cell programming method comprising:

setting the source, drain, bulk region and the gate electrodes of the first, second, third and fourth NMOS transistors to a positive reference voltage;

applying an inhibiting voltage to the source, drain and bulk region electrodes of the second NMOS read transistor while setting the source and drain electrodes of the first NMOS programming transistor to the positive reference voltage and maintaining the bulk region electrode of the first NMOS programming transistor at either the positive reference voltage or the inhibiting voltage;

ramping down the interconnected source, drain and bulk region electrodes of the fourth NMOS control transistor from the positive reference voltage to a predefined negative control voltage for a preselected programming time while ramping down the interconnected source, drain and bulk region electrodes of the third NMOS erase transistor from the positive reference voltage to a predefined negative erase voltage for the preselected programming time;

at the end of the preselected programming time, ramping up the interconnected source, drain and bulk regions electrodes of the fourth NMOS control transistor from the predefined negative control voltage to the positive reference voltage while ramping up the interconnected source, drain and bulk region electrodes of the third NMOS erase transistor from the predefined negative erase voltage to the positive reference voltage; and returning the source, drain, bulk region and gate electrodes of the first, third and fourth NMOS transistors to the positive reference voltage while setting the source, drain and bulk region electrodes of the second NMOS read transistor to the inhibiting voltage.

3. The method of claim 2, wherein the inhibiting voltage is 0V.

4. A method of programming a non-volatile memory (NVM) cell array that includes a plurality of NVM cells, each NMV cell in the array including a first NMOS programming transistor having a drain electrode, a bulk region electrode, a source electrode and a gate electrode connected to a common storage node, a second NMOS read transistor having a drain electrode, a bulk region electrode, a source electrode and a gate electrode connected to the common storage node, a third NMOS erase transistor having interconnected source, drain and bulk region electrodes and a gate electrode connected to the common storage node, and a fourth NMOS control transistor having interconnected source, drain and bulk region electrodes and a gate electrode connected to the common storage node, the NMV cell array programming method comprising:

setting the source, drain, bulk region and gate electrodes of the first, second, third and fourth NMOS transistors to a positive reference voltage;

for each NVM cell in the NVM cell array selected for programming, applying an inhibiting voltage to the source, drain and bulk region electrodes of the second NMOS read transistor while setting the source and drain electrodes of the first NMOS programming transistor to the positive reference voltage and maintaining the bulk region electrode of the first NMOS programming transistor at either the positive reference voltage or the inhibiting voltage;

for each NVM cell in the NVM cell array not selected for programming, setting the source, drain and bulk region electrodes of the second NMOS read transistor and of the first NMOS programming transistor to the inhibiting voltage;

for each NVM cell in the NVM cell array selected for programming, ramping down the interconnected source, drain and bulk region electrodes of the fourth NMOS control transistor from the positive reference voltage to a predefined negative control voltage for a preselected programming time while ramping down the interconnected source, drain and bulk region electrodes of the third NMOS erase transistor from the positive reference voltage to a predefined negative erase voltage for the preselected programming time;

for each NVM cell in the NVM cell array selected for programming, at the end of the preselected programming time, ramping up the interconnected source, drain and bulk region electrodes of the fourth NMOS control transistor from the predefined negative control voltage to the positive reference voltage while ramping up the interconnected source, drain and bulk region electrodes of the third NMOS erase transistor from the predefined negative erase voltage to the positive reference voltage; and for each NVM cell in the NVM cell array, returning the source, drain, bulk region and gate electrodes of the first, third and fourth NMOS transistors to the positive reference voltage while setting the source, drain and bulk region electrodes of the second NMOS read transistor to the inhibiting voltage.

5. The method of claim 4, wherein the inhibiting voltage is 0V.

* * * * *